(12) United States Patent
Defretin et al.

(10) Patent No.: US 9,431,375 B2
(45) Date of Patent: Aug. 30, 2016

(54) HIGH DENSITY MICROELECTRONICS PACKAGING

(75) Inventors: Harmel Jean Defretin, Sugar Land, TX (US); Tao Xu, Houston, TX (US); Glenn Gardner, Cypress, TX (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 10 days.

(21) Appl. No.: 14/009,315

(22) PCT Filed: Mar. 29, 2012

(86) PCT No.: PCT/US2012/031060
§ 371 (c)(1),
(2), (4) Date: Oct. 1, 2013

(87) PCT Pub. No.: WO2012/135406
PCT Pub. Date: Oct. 4, 2012

(65) Prior Publication Data
US 2015/0130040 A1    May 14, 2015

Related U.S. Application Data

(60) Provisional application No. 61/470,579, filed on Apr. 1, 2011.

(51) Int. Cl.
*H01L 23/02* (2006.01)
*H01L 25/07* (2006.01)
(Continued)

(52) U.S. Cl.
CPC ............ *H01L 25/071* (2013.01); *H01L 22/10* (2013.01); *H01L 23/053* (2013.01); *H01L 23/06* (2013.01); *H01L 23/10* (2013.01); *H01L 23/15* (2013.01); *H01L 23/36* (2013.01); *H01L 25/0652* (2013.01); *H01L 25/0657* (2013.01); *H01L 25/165* (2013.01); *H01L 25/50* (2013.01);
(Continued)

(58) Field of Classification Search
USPC .................................................. 257/686, 777
See application file for complete search history.

(56) References Cited

U.S. PATENT DOCUMENTS 2,984,774 A * 5/1961 Race .................. H01L 23/4006
165/185
4,152,616 A * 5/1979 Ozbirn .................. H01L 41/053
174/551

(Continued)

FOREIGN PATENT DOCUMENTS

| JP | 2005072421 A | 3/2005 |
| JP | 2007049099 A | 2/2007 |
| WO | 2005020288 A2 | 3/2005 |

OTHER PUBLICATIONS

B. Martin et al., "Brazing Contact Pins to Ceramic Substrates", IBM Technical Disclosure Bulletin, Feb. 1, 1972, p. 2594.*

(Continued)

*Primary Examiner* — Meiya Li
*Assistant Examiner* — Peter M Albrecht
(74) *Attorney, Agent, or Firm* — John Vereb (57) ABSTRACT

Example packaging of microelectronics and example methods of manufacturing the same are provided herein. The packaging can enable and/or improve the use of the microelectronics in a downhole, high temperature and/or high pressure setting. The microelectronics packaging can include double-sided active components, heat sinks, and/or three-dimensional stacking of dies.

22 Claims, 12 Drawing Sheets

(51) Int. Cl.
  *H01L 23/10*      (2006.01)
  *H01L 25/065*     (2006.01)
  *H01L 25/16*      (2006.01)
  *H01L 25/00*      (2006.01)
  *H01L 23/053*     (2006.01)
  *H01L 21/66*      (2006.01)
  *H01L 23/06*      (2006.01)
  *H01L 23/15*      (2006.01)
  *H01L 23/36*      (2006.01)
  *H01L 25/04*      (2014.01)
  *H01L 23/00*      (2006.01)

(52) U.S. Cl.
  CPC ............... *H01L24/73* (2013.01); *H01L 25/04* (2013.01); *H01L 2224/32145* (2013.01); *H01L 2224/32225* (2013.01); *H01L 2224/48227* (2013.01); *H01L 2224/73215* (2013.01); *H01L 2224/73265* (2013.01); *H01L 2224/92247* (2013.01); *H01L 2225/0651* (2013.01); *H01L 2225/06562* (2013.01); *H01L 2225/06568* (2013.01); *H01L 2225/06572* (2013.01); *H01L 2225/06589* (2013.01); *H01L 2924/19105* (2013.01); *H01L 2924/19107* (2013.01)

(56) References Cited

U.S. PATENT DOCUMENTS

| | | | | |
|---|---|---|---|---|
| 4,996,588 A * | 2/1991 | Malbe et al. | ................. | 257/774 |
| 5,206,460 A * | 4/1993 | Yang | ................... | H03H 9/0547 174/559 |
| 5,291,064 A | 3/1994 | Kurokawa | | |
| 5,739,586 A * | 4/1998 | Cannizzaro | ......... | H01L 23/3677 257/706 |
| 5,886,408 A | 3/1999 | Ohki et al. | | |
| 5,900,673 A * | 5/1999 | Nishi et al. | .................... | 257/772 |
| 5,917,272 A * | 6/1999 | Clark | ....................... | H03H 9/08 219/210 |
| 6,005,778 A * | 12/1999 | Spielberger et al. | ......... | 361/770 |
| 6,051,886 A * | 4/2000 | Fogal et al. | ................. | 257/777 |
| 6,207,474 B1 | 3/2001 | King et al. | | |
| 6,297,549 B1 * | 10/2001 | Hiyoshi | ........................ | 257/703 |
| 6,310,775 B1 * | 10/2001 | Nagatomo et al. | ........... | 361/707 |
| 6,329,221 B1 | 12/2001 | King et al. | | |
| 6,445,063 B1 | 9/2002 | King et al. | | |
| 6,465,275 B2 | 10/2002 | King et al. | | |
| 6,579,747 B1 | 6/2003 | Zuo | | |
| 6,656,767 B1 | 12/2003 | King et al. | | |
| 6,677,671 B2 | 1/2004 | King et al. | | |
| 6,700,138 B2 * | 3/2004 | Crane, Jr. | ............ | G02B 6/4292 257/678 |
| 6,809,413 B1 | 10/2004 | Peterson et al. | | |
| 6,853,055 B1 | 2/2005 | Kuang | | |
| 7,102,220 B2 * | 9/2006 | Stevens | ................. | H01L 23/055 257/686 |
| 7,508,057 B2 * | 3/2009 | Shiraishi | ................ | B81B 7/007 257/684 |
| 2004/0065963 A1 | 4/2004 | Karnezos | | |
| 2005/0132648 A1 * | 6/2005 | Miyahara | ............. | B01J 19/0093 48/127.9 |
| 2006/0125076 A1 | 6/2006 | Fukagaya et al. | | |
| 2007/0108634 A1 | 5/2007 | Higashi et al. | | |

OTHER PUBLICATIONS

International Search Report for PCT Application Serial No. PCT/US2012/031060 dated Oct. 31, 2012.
Communication pursuant to Article 94(3) EPC for EP Application No. 12764630.5 dated Feb. 1, 2016.
Examiner's Report for Canadian Application CA2831916 dated Apr. 17, 2015.
Examiner's Report for Canadian Application CA2831916 dated Dec. 4, 2015.
Supplementary European Search Report for EP Application No. 12764630.5 dated Sep. 16, 2014.
Notice of Allowance for Mexican Patent Application No. MX/a/2103/011403 dated Feb. 4, 2016.
Official Action for Mexican Patent Application No. MX/a/2103/011403 dated Feb. 4, 2015.
Official Action for Mexican Patent Application No. MX/a/2103/011403 dated Aug. 21, 2015.

* cited by examiner

HIGH DENSITY MICROELECTRONICS PACKAGING

BACKGROUND OF THE DISCLOSURE

1. Field of the Disclosure

The disclosure relates generally to the field of components for downhole instruments. More specifically, the disclosure relates to packaging of microelectronics components for use in a downhole, high temperature and/or high pressure setting.

2. Background Art

High reliability and high capacity recording memory/controllers are often used in downhole tools, such as wireline or logging-while-drilling (LWD) tools. Conventional packaging of multi-chip module (MCM) technology leads to MCMs of a certain size and weight. Moreover, in the past decade, the high density packaging development is mainly driven by the consumer portable electronics market, which targets the temperature range of 0° C. to 85° C. Though significant progress has been made, the reliability of those solutions in downhole high temperature high shock environment is unknown.

Accordingly, it may be desirable for new MCM packaging technology, which can improve upon one or more aspects of conventional MCM packaging.

DETAILED DESCRIPTION

The disclosure provides microelectronics components for use in downhole electronic instruments and methods for manufacturing the same. Certain embodiments will be described below, including in the following FIGS. 1-13, which depict representative or illustrative embodiments of the disclosure.

Figure 1:
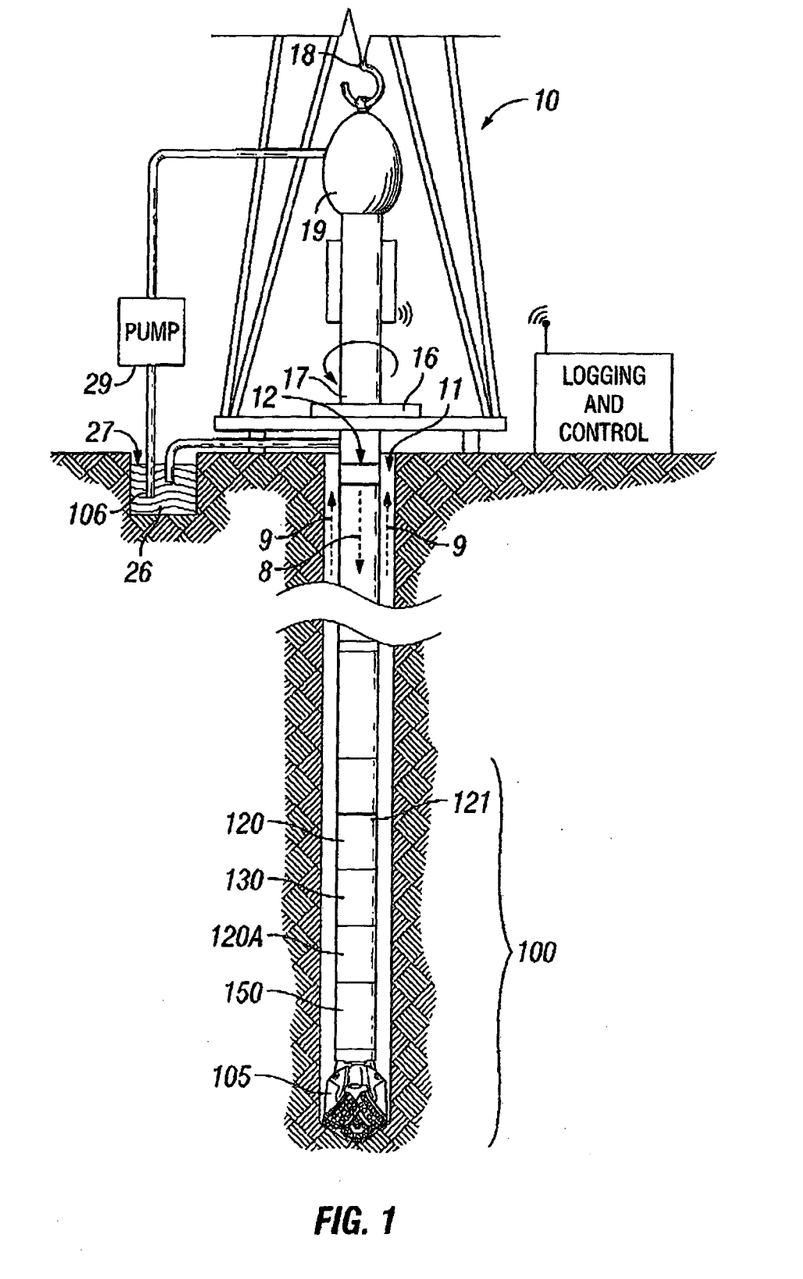
FIG. 1 illustrates a wellsite system in which the present disclosure can be employed, according to an example embodiment.

FIG. 1 illustrates a wellsite system in which the present disclosure can be employed, according to an example embodiment. The wellsite can be onshore or offshore. In this exemplary system, a borehole 11 is formed in subsurface formations 106 by rotary drilling in a manner that is well known. Embodiments of the disclosure can also use directional drilling, as will be described hereinafter.

A drill string 12 is suspended within the borehole 11 and has a bottom hole assembly 100 which includes a drill bit 105 at its lower end. The surface system includes platform and derrick assembly 10 positioned over the borehole 11, the assembly 10 including a rotary table 16, Kelly 17, hook 18 and rotary swivel 19. The drill string 12 is rotated by the rotary table 16, energized by means not shown, which engages the Kelly 17 at the upper end of the drill string. The drill string 12 is suspended from a hook 18, attached to a travelling block (also not shown), through the Kelly 17 and a rotary swivel 19 which permits rotation of the drill string relative to the hook. As is well known, a top drive system could alternatively be used.

In the example of this embodiment, the surface system further includes drilling fluid or mud 26 stored in a pit 27 formed at the well site. A pump 29 delivers the drilling fluid 26 to the interior of the drill string 12 via a port in the swivel 19, causing the drilling fluid to flow downwardly through the drill string 12 as indicated by the directional arrow 8. The drilling fluid exits the drill string 12 via ports in the drill bit 105, and then circulates upwardly through the annulus region between the outside of the drill string and the wall of the borehole 11, as indicated by the directional arrows 9. In this well known manner, the drilling fluid lubricates the drill bit 105 and carries formation 106 cuttings up to the surface as it is returned to the pit 27 for recirculation.

In various embodiments, the systems and methods disclosed herein can be used with any means of conveyance known to those of ordinary skill in the art. For example, the systems and methods disclosed herein can be used with tools or other electronics conveyed by wireline, slickline, drill pipe conveyance, coiled tubing drilling, and/or a while-drilling conveyance interface. For the purpose of an example only, FIG. 1 depicts a while-drilling interface. However, systems and methods disclosed herein could apply equally to wireline or any other suitable conveyance means. The bottom hole assembly 100 of the illustrated embodiment includes a logging-while-drilling (LWD) module 120, a measuring-while-drilling (MWD) module 130, a roto-steerable system and motor, and drill bit 105.

The LWD module 120 is housed in a special type of drill collar, as is known in the art, and can contain one or a plurality of known types of logging tools (e.g., logging tool 121). It will also be understood that more than one LWD and/or MWD module can be employed, e.g. as represented at 120A. (References, throughout, to a module at the position of 120 can alternatively mean a module at the position of 120A as well.) The LWD module includes capabilities for measuring, processing, and storing information, as well as for communicating with the surface equipment. In the present embodiment, the LWD module includes a nuclear magnetic resonance measuring device.

The MWD module 130 is also housed in a special type of drill collar, as is known in the art, and can contain one or more devices for measuring characteristics of the drill string and drill bit. The MWD tool further includes an apparatus (not shown) for generating electrical power to the downhole system. This may typically include a mud turbine generator powered by the flow of the drilling fluid, it being understood that other power and/or battery systems may be employed. In the present embodiment, the MWD module includes one or more of the following types of measuring devices: a weight-on-bit measuring device, a torque measuring device, a vibration measuring device, a shock measuring device, a stick slip measuring device, a direction measuring device, and an inclination measuring device.

A variety of the components described above with reference to the exemplary wellsite system—and/or a variety of other components that may be recognized by one of ordinary skill in the art having benefit of the present disclosure—may include microelectronics that may benefit from being capable of withstanding high temperatures and/or high pressures in a downhole setting. For example, both logging while drilling and wireline tools (e.g., a high temperature triple combo tool that may be needed to operate at temperature around or above 200° C.), in particular may contain such microelectronics that may benefit from being able to withstand high temperatures and/or high pressures. Various other types of tools with a variety of conveyance mechanisms, such as coiled tubing, wired drill pipe, slickline, and the like, also can utilize such microelectronics at a variety of standard and high temperatures.

Various embodiments of high density microelectronics packaging can be theoretically divided into four aspects: (1) Double-sided active component attachment; (2) heat sink for medium power; (3) 3D die stacking; and (4) known good populated substrate. Each of these building blocks will now be described in more detail. The separation of these aspects are for discussion purposes only. As may be recognized by one of ordinary skill in the art, the various embodiments of the packaging can be made by using one, two, three, or four of the aspects, and can be fabricated in any suitable order. Additionally, each aspect could be used with alternative or additional processes and components, as may be recognized by one of ordinary skill in the art having benefit of the present disclosure.

Aspect 1: Double-Sided Active Component Attachment.

In one embodiment, the first aspect for certain example embodiments of the microelectronics packaging disclosed herein can be the use of active die on both sides of the substrate. There are several methods to mount a multi-chip module (MCM) onto a printed circuit board (PCB) or on a chassis. In some embodiments, pin-grid-array (PGA) and bathtub type MCMs can be soldered directly onto a through-hole PCB. Usually, PGA type MCM has a seal ring on top of the substrate for lid sealing and pins on bottom side of the substrate for mounting and electrical connection. Chassis-mounted MCMs can, in various example embodiments, be screwed via mounting holes, glued or suspended in potting. Thus it can have a housing to accommodate the ceramic substrate.

In certain embodiments of the microelectronics packaging disclosed herein, for double-sided active component attachment, a chassis mounted MCM can be used. The ceramic substrates can be glued onto the housing with non-conductive adhesive to cover at least a major part of the back side of the substrate. However, if active components are attached to both sides of the substrate, the contact area between the housing and substrate can be limited—i.e., on the perimeter of each side of the substrate. If glue is still used to attach the double-sided substrate onto the housing, the reliability of the package may suffer, which means substrates can delaminate from the housing. Thus, a challenge for double-sided active component attachment can lie in the method of how to attach the ceramic substrate reliably to the metal housing.

Figure 2A:
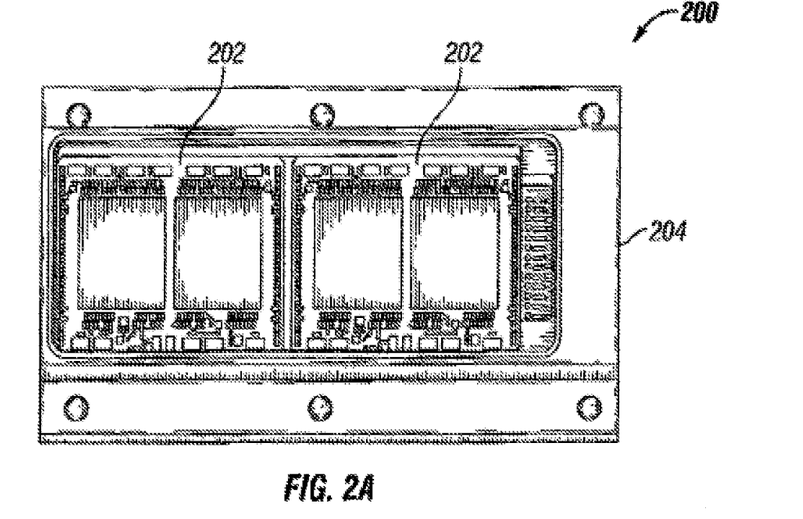
FIG. 2A illustrates a top view of an MCM subassembly having two substrates directly brazed onto a metal housing, according to an example embodiment.
Figure 2B:
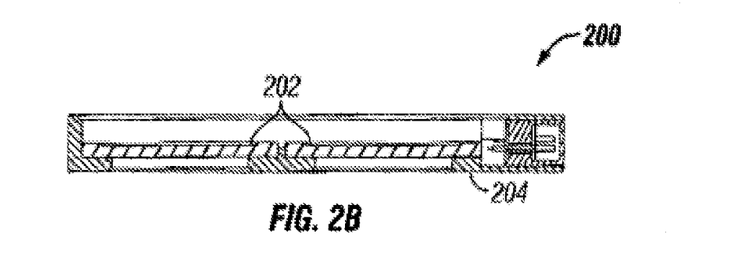
FIG. 2B illustrates a cross-sectional view of the MCM subassembly of FIG. 2A, according to an example embodiment.
Figure 2C:
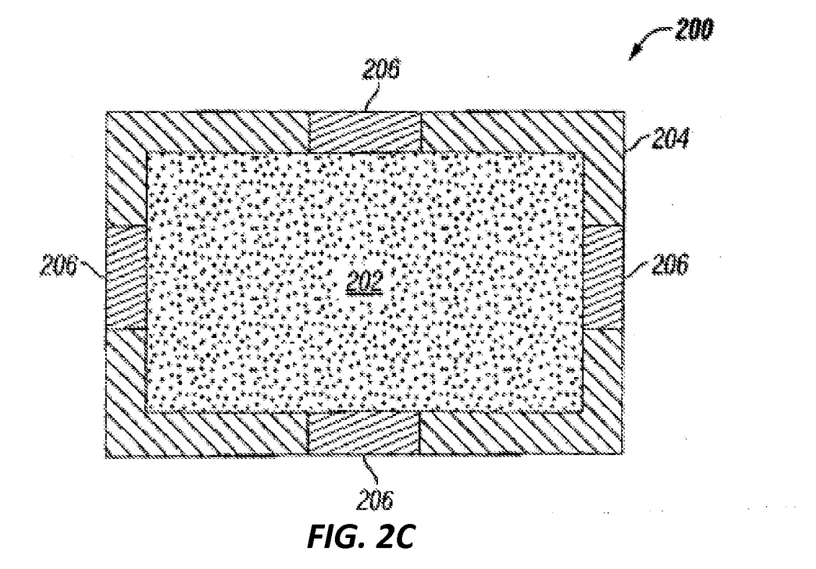
FIG. 2C illustrates a schematic view of the MCM subassembly of FIG. 2A showing a four-point brazing area on the substrate, according to an example embodiment.

In various embodiments of the microelectronics packaging disclosed herein, three methods can be used to attach the double-sided ceramic substrate reliably onto the metal housing or other type of housing with limited contact area: (1) direct brazing of a substrate to a metal housing; (2) brazing the substrate to a metal frame then welding the frame onto the housing; and (3) brazing the substrate to metal posts then welding the posts onto the housing. Other embodiments and methods consistent with the present disclosure are possible, as are combinations and subcombinations of the foregoing, as may be recognized by one of ordinary skill in the art having benefit of the present disclosure. FIG. 2A illustrates a top view of an MCM subassembly 200 having two substrates 202 directly brazed onto a housing 204, according to an example embodiment. FIG. 2B illustrates a cross-sectional view of the MCM subassembly 200 of FIG. 2A, according to an example embodiment. FIG. 2C illustrates a schematic view of the MCM subassembly 200 of FIG. 2A showing a four-point brazing area on the substrate 202, according to an example embodiment.

As shown in FIGS. 2A-C, an MCM can include a substrate 202 that is brazed directly to a metal or other housing 204. In some embodiments, the substrate 202 can be a high temperature cofired ceramic (HTCC) substrate 202. In some embodiments, brazing can be considered a metal joining process whereby a filler metal is heated above its melting point and distributed between two or more close-fitting parts by capillary action. The filler metal is brought slightly above its melting temperature while protected by a suitable atmosphere. It then flows over the base metal (known as wetting) and is then cooled to join the work pieces together. The braze alloy joins the materials and compensates for the difference in their expansion rates.

With direct brazing, as shown in FIGS. 2A-C, where there is a relatively large coefficient of thermal expansion (CTE) mismatch between the metal housing 204 and the ceramic substrate 202, it can be desirable to use point brazing (i.e., where braze fillers apply to certain sides 206 of the perimeter as shown in FIG. 2C) instead of a continuous braze filler around the substrate 202 to reduce the contact area. The direct brazing method can be a relatively simple process which may not necessitate complex fixtures and processing steps. Nonetheless, in some embodiments, the majority of the mass may be of the metal housing 204, and thus the HTCC or other substrate 202 may be under large residual stress during the brazing cooling step. In some embodiments, therefore, the substrate 202 may crack after brazing unless the housing 204 material has a close CTE with the substrate 202.

Figure 3A:
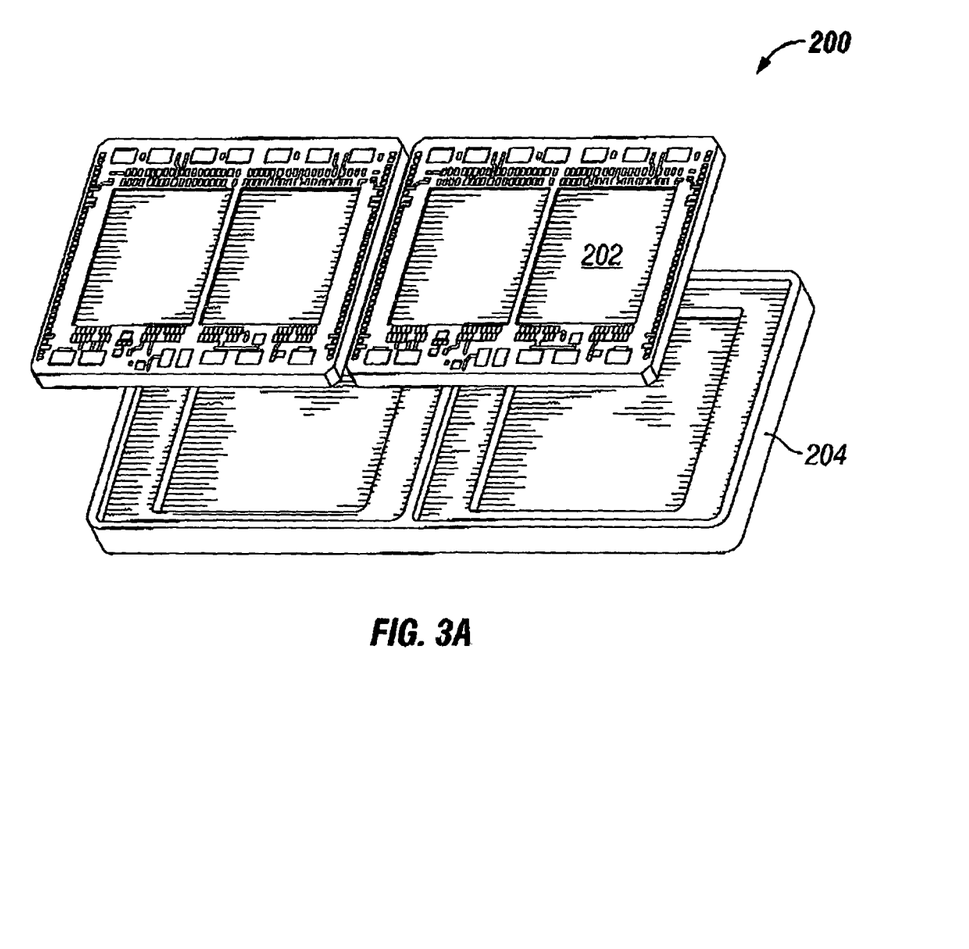
FIG. 3A illustrates a top exploded view of an MCM subassembly having two substrates brazed onto an intermediate frame welded onto the metal housing, according to an example embodiment.
Figure 3B:
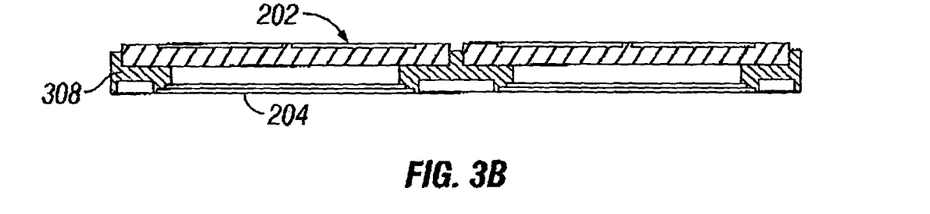
FIG. 3B illustrates a cross-sectional view of the MCM subassembly of FIG. 3A, according to an example embodiment.

FIG. 3A illustrates a top exploded view of an MCM subassembly 200 having two substrates 202 brazed onto an intermediate frame 308 welded onto the metal housing 204, according to an example embodiment. FIG. 3B illustrates a cross-sectional view of the MCM subassembly 200 of FIG. 3A, according to an example embodiment. The embodiments of FIGS. 3A-B illustrate certain aspects of the second option (i.e., the frame brazing method) described above, wherein the intermediate metal frame 308 can be first brazed onto the ceramic substrate 202, and then welded onto the main metal housing 204. In certain embodiments, this option can reduce the internal residual stress between the ceramic substrate 202 and metal housing 204 during brazing. In some embodiments, the intermediate frame 308 can be made of the same type of material as the metal housing 204. In some embodiments, the welding can be performed using laser welding.

In some embodiments, the frame brazing method can use welding to connect the substrate 202 to housing 204. In some embodiments, the frame brazing method can be more costly than the comparative part made by the direct brazing method; however, the substrate 202 cracking issue can be better controlled using the frame brazing method.

Figure 4A:
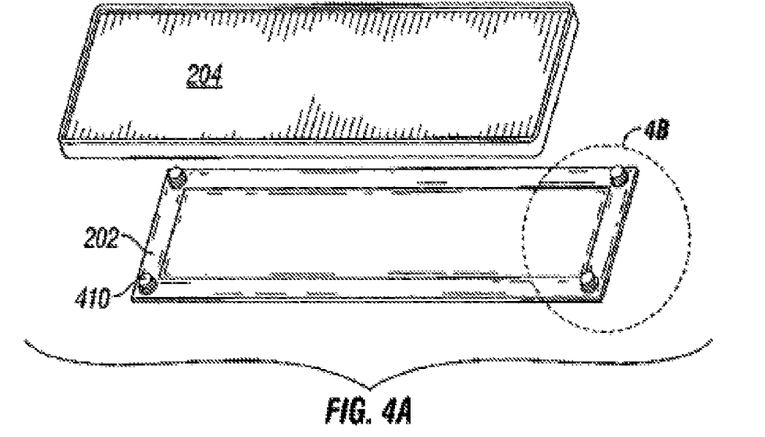
FIG. 4A illustrates a top exploded view of an MCM subassembly brazed with posts welded onto a metal housing, according to an example embodiment.
Figure 4B:
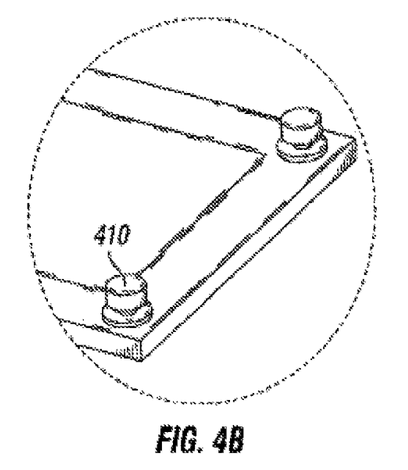
FIG. 4B illustrates a zoomed-in view of the substrate and posts of the MCM subassembly of FIG. 4A, according to an example embodiment.
Figure 4C:
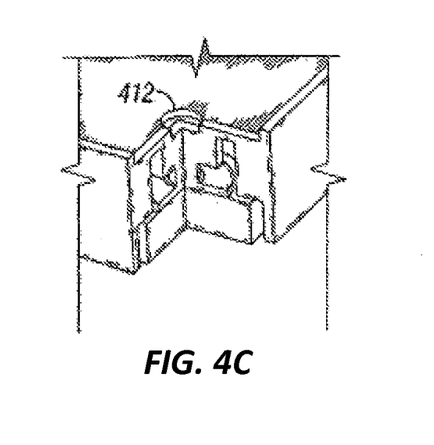
FIG. 4C illustrates a zoomed-in view of a welding area for the posts of the MCM subassembly of FIG. 4A, according to an example embodiment.

FIG. 4A illustrates a top exploded view of an MCM subassembly 200 brazed with posts welded onto a metal housing 204, according to an example embodiment. FIG. 4B illustrates a zoomed-in view of the substrate 202 and posts 410 of the MCM subassembly 200 of FIG. 4A, according to an example embodiment. FIG. 4C illustrates a zoomed-in view of a welding area 412 for the posts 410 of the MCM subassembly 200 of FIG. 4A, according to an example embodiment.

As shown in FIGS. 4A-C, to minimize the contact area and stress between the ceramic substrates 202 and the brazed metal part, metal posts 410 can be brazed onto the ceramic substrate 202. In some embodiments, the metal posts 410 can be brazed to the substrate 202 at four corners, and/or in the middle of the long sides. In some embodiments, these posts 410 can be welded onto the housing 204 with welding areas 412 (e.g., holes) to accommodate these posts 410, as shown in FIG. 4C. In some embodiments, the substrate 202 may be floating in the metal housing 204 with the posts 410 connected to the housing 204, which is in contrast to the direct brazing and frame brazing methods discussed above—which may involve attaching long HTCC or other substrates 202 onto the metal housing 204 thereby creating the possibility of substrate 202 warping. In the post brazing method, the possibility of substrate 202 warping may be decreased by minimizing the brazed area and letting the substrate 202 float on the housing 204, i.e., minimum stress is applied to the substrate 202 in this configuration. In some embodiments, however, post brazing may necessitate delicate fixtures to hold posts 410 during brazing process and containers to handle the substrate 202 with posts 410.

Aspect 2: Heat Sink for Medium Power.

In some embodiments, heat sinks 518 can be incorporated into MCMs to dissipate heat for medium to high power devices or partition 516. The heat sinks 518 can be added in MCMs that contain the double-sided active component attachment described above as well as in MCMs that do not contain such an attachment.

Figure 5A:
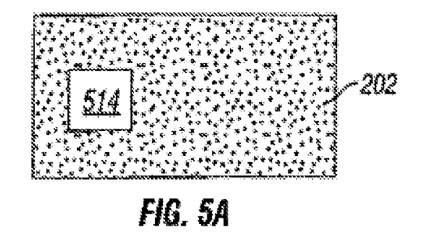
FIG. 5A illustrates a schematic of a substrate for an MCM subassembly having an opening for a high-power partition, according to an example embodiment.
Figure 5B:
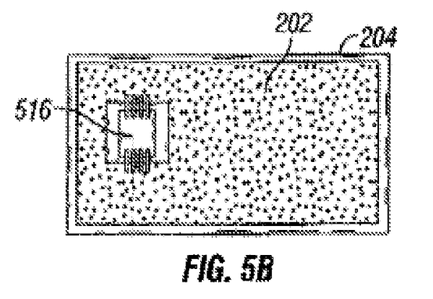
FIG. 5B illustrates a schematic of the front side of the substrate of FIG. 5B placed in a metal housing, according to an example embodiment.
Figure 5C:
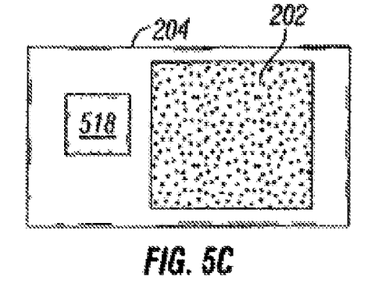
FIG. 5C illustrates a schematic of the back side of the substrate of FIG. 5A placed in a metal housing and having a heat sink, according to an example embodiment.
Figure 5D:
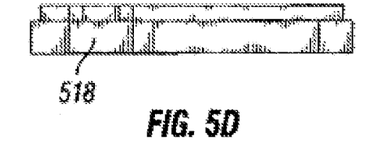
FIG. 5D illustrates a side-view schematic of the substrate of FIG. 5A, placed in the metal housing having the heat sink, according to an example embodiment.

FIG. 5A illustrates a schematic of a substrate 202 for an MCM subassembly 200 having an opening 514 for a high-power partition 516, according to an example embodiment. FIG. 5B illustrates a schematic of the front side of the substrate 202 of FIG. 5B placed in a metal housing 204, according to an example embodiment. FIG. 5C illustrates a schematic of the back side of the substrate 202 of FIG. 5A placed in a metal housing 204 and having a heat sink 518, according to an example embodiment. FIG. 5D illustrates a side-view schematic of the substrate 202 of FIG. 5A, placed in the metal housing 204 having the heat sink 518, according to an example embodiment.

As shown in FIG. 5A-D, the HTCC or other substrate 202 has an opening 514 for mounting the medium to high power device or partial module. In some embodiments, the substrate 202 does not have high thermal conductivity, and the low power components can be mounted thereon, while the devices/components with medium to high power consumption/dissipation can be mounted either directly onto the heat sink 518 or on a small substrate (not shown) with high thermal conductivity (made of BeO, AlN, or other types of materials that may be recognized by one of ordinary skill in the art having benefit of the present disclosure) and then mounted onto the heat sink 518. On the housing 204 side, the substrate 202 can be attached onto the metal housing 204 using one of the three options as described above. The housing 204 can have two openings, as shown in FIG. 5C: a first opening for the heat sink 518 and a second opening for the back side of the substrate 202. The heat sink 518 can be brazed onto the metal housing 204 as shown in FIG. 5B. The low power part of the module can be double sided with a window opened in the housing 204 as demonstrated in FIG. 5C.

Aspect 3: 3D Die Stacking.

To further increase the vertical packaging density, die stacking can be used to package multiple dies on top of one another. For high temperature and/or high pressure applications, new materials and processes may need to be used to make this technology compatible with the harsh environment. Various example structures and methods of 3D die stacking are shown in FIGS. 6-10. Other structures and methods consistent with the present disclosure are also possible.

Figure 6:
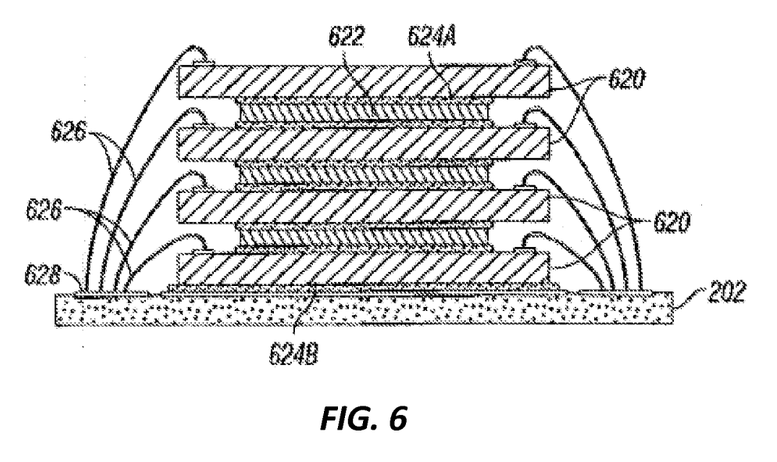
FIG. 6 illustrates a schematic of an MCM subassembly with stacked dies and spacers, according to an example embodiment.

FIG. 6 illustrates a schematic of an MCM subassembly 200 with stacked dies 620 and spacers 622, according to an example embodiment. As shown in FIG. 6, die-stacking can be performed in some embodiments with dies 620 of substantially the same size stacked with spacers 622. In some embodiments, the dies 620 can be bonded to the spacers 622 using epoxy 624A. The dies 620 can be connected to a bonding pad 628 on the substrate 202 via bonding wires 626, which can connect the dies 620 with the substrate 202.

These example dies 620 can be used to build memory recorders where multiple flash memory dies 620 of the same kind can be stacked, and the dies 620 of the same stack can share the same address bus and data bus. The stacked dies 620 in the same array can share some or most of the bonding pads 628 on the substrate 202, and thus the footprint area for the dies 620 can be reduced accordingly. In some embodiments, the spacers 622 can be used to create clearance for the bonding wire 626 loops.

Figure 7A:
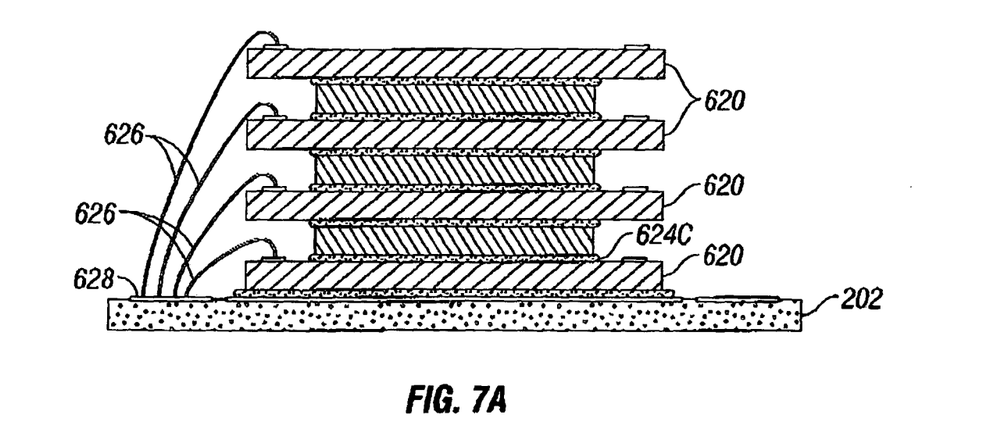
FIG. 7A illustrates a side-view schematic of an MCM subassembly with stacked dies without spacers, according to an example embodiment.
Figure 7B:
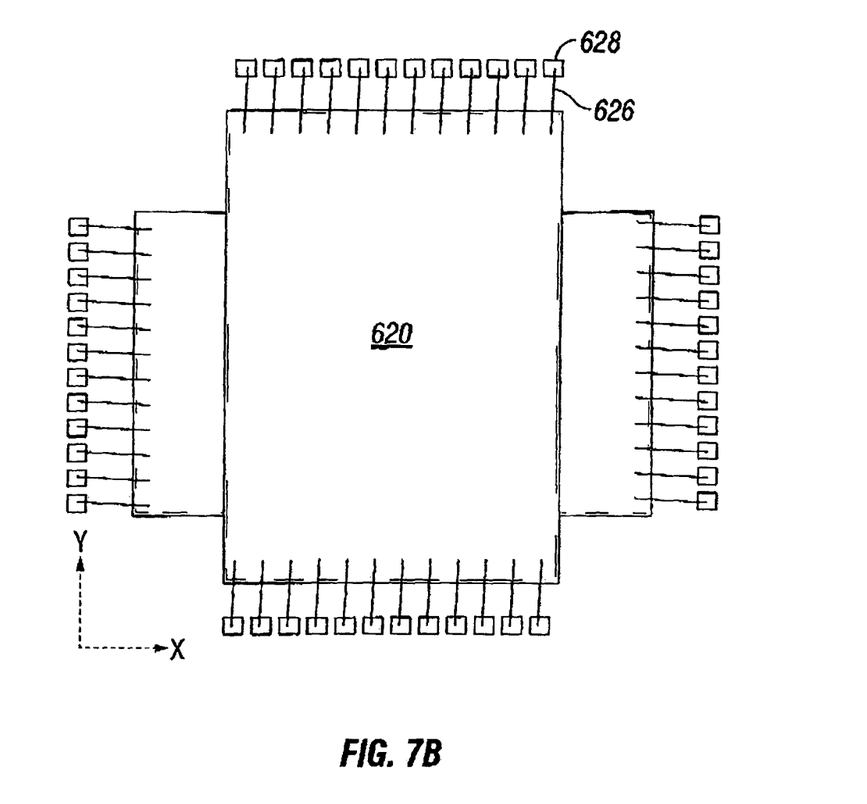
FIG. 7B illustrates a top-view schematic of the MCM subassembly of FIG. 7A, according to an example embodiment.

FIG. 7A illustrates a side-view schematic of an MCM subassembly 200 with stacked dies 620 without spacers 622, according to an example embodiment. FIG. 7B illustrates a top-view schematic of the MCM subassembly 200 of FIG. 7A, according to an example embodiment. As shown in FIGS. 7A-B, die-stacking with same size dies 620 stacked without spacers 622 can be achieved. In some embodiments, stacking same-sized dies 620 on top of each other can be achieved by using generally rectangular shaped dies 620, and alternating the orientation between each die 620. For example, as shown in FIGS. 7A-B, dies 620 can be alternately oriented in an x-direction and a y-direction. Also as shown, particularly in FIG. 7B, each die 620 can have a bonding pad 628 and corresponding bonding wires 626 along the shorter side of the generally rectangular shaped die 620.

In some embodiments, after a first die 620 is attached to the substrate 202 and connected to the circuit using bonding wires 626, the second die 620 is attached onto the first die 620 with 90-degree rotation to the first die 620 using non-conductive epoxy 624C. The second die 620 is then connected to the substrate 202 with bonding wires 626. Each die 620 itself can serve as a spacer between the dies 620 in neighboring stacks. This setup can eliminate the use of extra spacers 622, and thus can increase the vertical density of the MCM subassembly 200 by approximately fifty percent in comparison to the embodiment illustrated in FIG. 6. In some embodiments, the higher vertical density can be compensated by the extra substrate 202 bond pad area to accommodate the bonding wires 626 in the other orientation. In some embodiments, such as where the packaging density may be limited by the total height of the stack, using an embodiment similar to that of FIGS. 7A-B can achieve higher overall packaging density than the embodiment of FIG. 6.

Figure 8A:
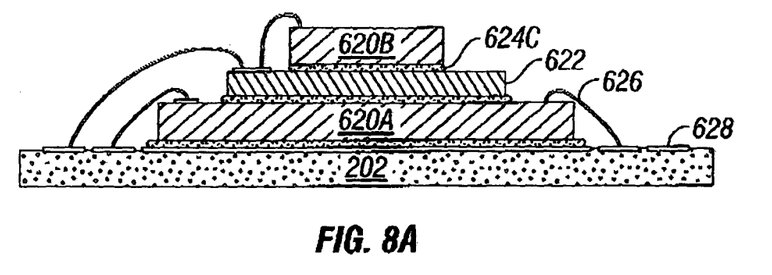
FIG. 8A illustrates a side-view schematic of an MCM subassembly with stacked dies of different sizes and spacers, according to an example embodiment.
Figure 8B:
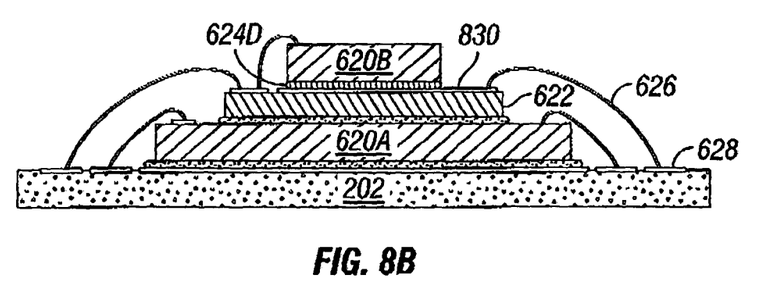
FIG. 8B illustrates a side-view schematic of an MCM subassembly with stacked dies of different sizes and spacers with a conductive epoxy, according to an example embodiment.
Figure 8C:
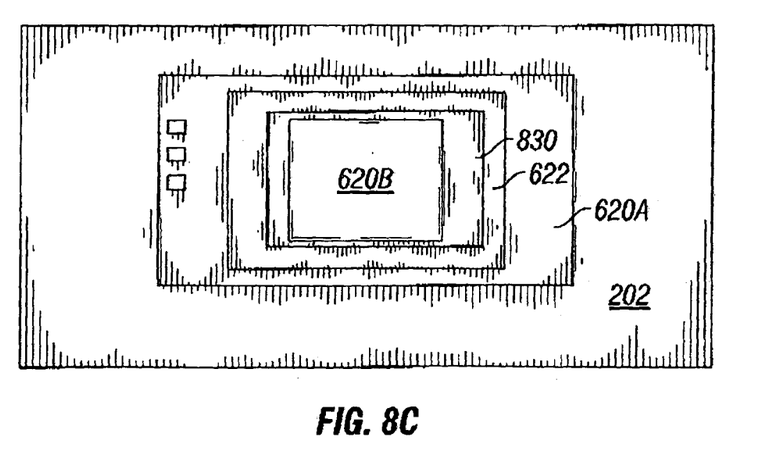
FIG. 8C illustrates a top-view schematic of the MCM subassembly of FIG. 8A, according to an example embodiment.

FIG. 8A illustrates a side-view schematic of an MCM subassembly 200 with stacked dies 620A-B of different sizes and spacers 622, according to an example embodiment. FIG. 8B illustrates a side-view schematic of an MCM subassembly 200 with stacked dies 620A-B of different sizes and spacers 622 with a conductive epoxy 624D, according to an example embodiment. FIG. 8C illustrates a top-view schematic of the MCM subassembly 200 of FIG. 8B, according to an example embodiment. As shown in FIGS. 8A-C, in example embodiments, die-stacking can utilize dies 620A-B with different size.

In certain example embodiments, as shown in FIGS. 8A-C, a wire bondable spacer 622 can be used in between the two dies 620A-B as an intermediate step to connect the small die 620A-B with the substrate 202. If an upper die 620B (i.e., one other than the bottom-most die 620A) does not have a back side connection, it can be desirable for the die 620B to be mounted on the spacer 622 with non-conductive epoxy 624C, as illustrated in FIG. 8A. In some embodiments, if the upper die 620B has a back side connection, then it can be desirable for the die 620B to be mounted on the spacer 622 with conductive epoxy 624D, as shown in FIG. 8B. In example embodiments, the die mounting pad 830 on the spacer 622 can be gold-plated and wire bonded to the substrate 202. In some embodiments, the gold-plating and wire bonding can connect the back side of the dies 620 to the substrate 202.

Figure 9A:
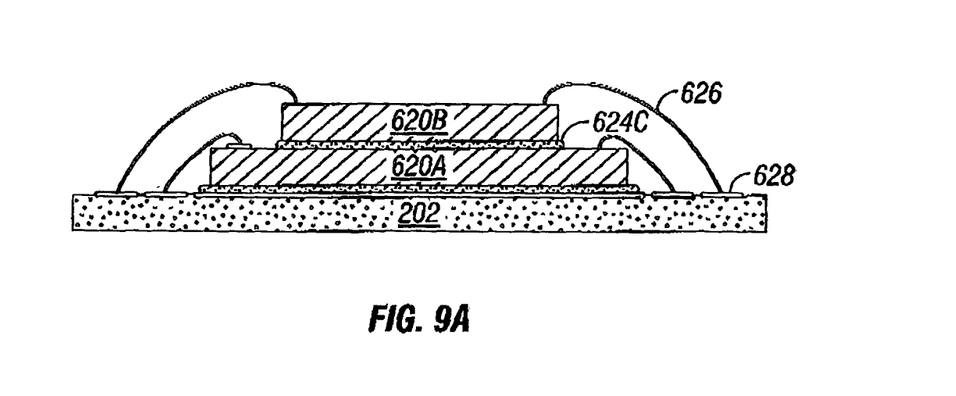
FIG. 9A illustrates a side-view schematic of an MCM subassembly with stacked dies of different sizes, according to an example embodiment.
Figure 9B:
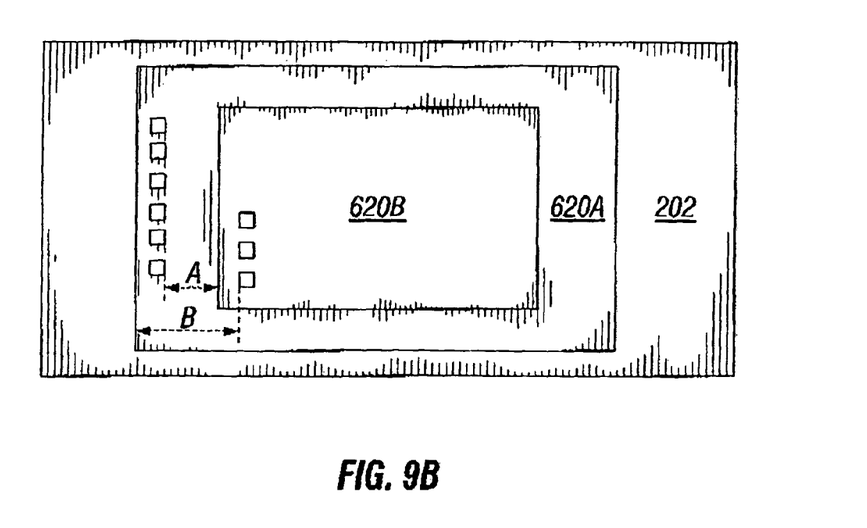
FIG. 9B illustrates a top view of the MCM subassembly of FIG. 9A, according to an example embodiment.

FIG. 9A illustrates a side-view schematic of an MCM subassembly 200 with stacked dies 620A-B of different sizes, according to an example embodiment. FIG. 9B illustrates a top view of the MCM subassembly 200 of FIG. 9A, according to an example embodiment. The MCM subassembly 200 of FIGS. 9A-B is similar to that of the MCM subassembly 200 of FIGS. 8A-C, except that spacers 622 are not included. In certain embodiments, such as where the dies 620A-B are closer in size to each other, a spacer 622 may or may not be helpful and thus can be omitted. As shown in FIGS. 9A-B, the top die 620B is mounted directly on the lower die 620A with non-conductive epoxy 624C. Other suitable arrangements consistent with these concepts are possible.

Figure 10A:
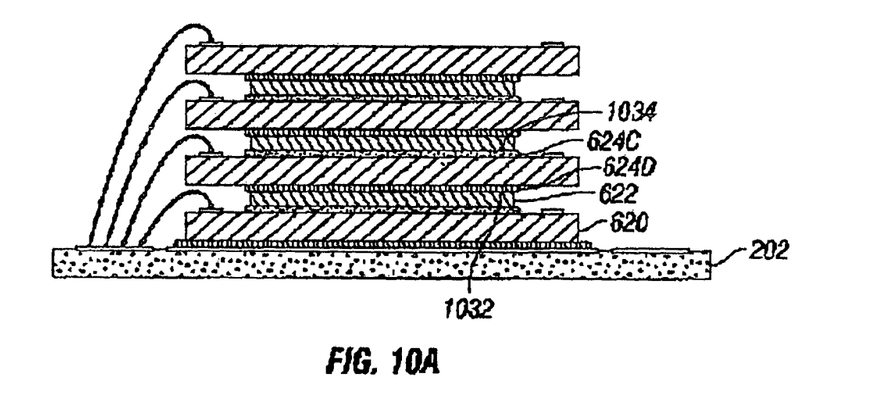
FIG. 10A illustrates a side-view schematic of an MCM subassembly with dies having back-side configuration, according to an example embodiment.
Figure 10B:
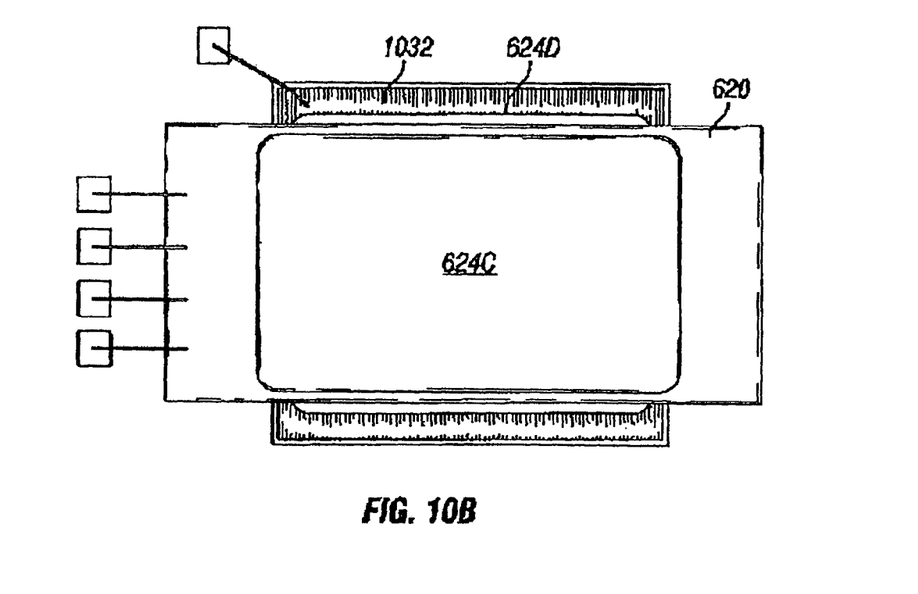
FIG. 10B illustrates a top-view schematic of the MCM subassembly of FIG. 10A, according to an example embodiment.
Figure 11A:
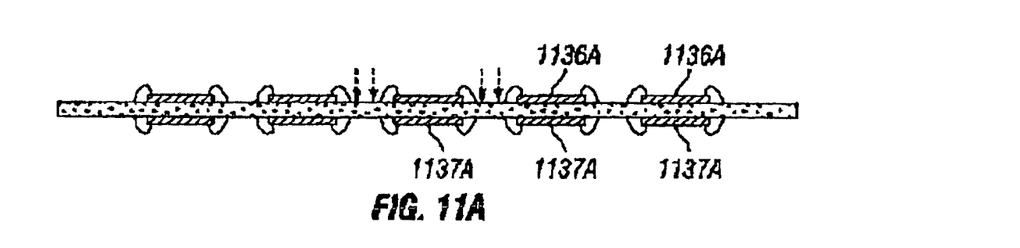
FIG. 11 illustrates a schematic of a substrate testing procedure, according to an example embodiment.
Figure 11B:
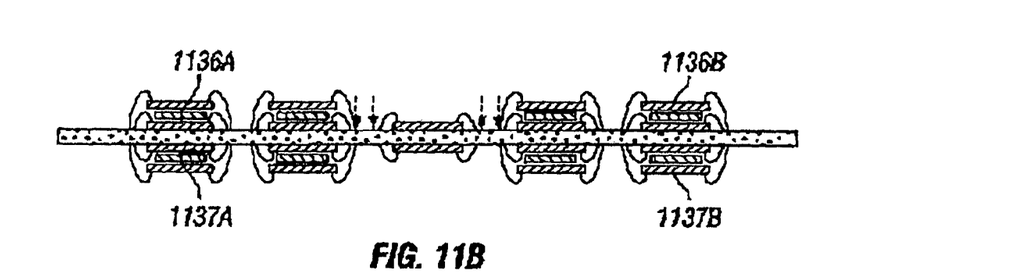
Figure 11C:
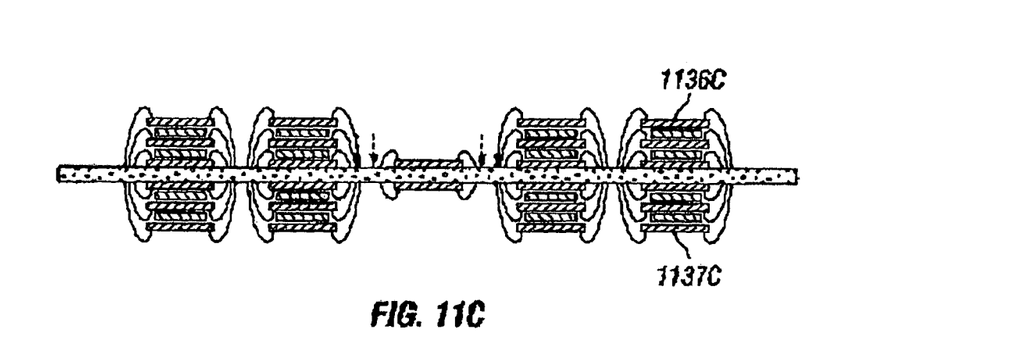
Figure 11D:
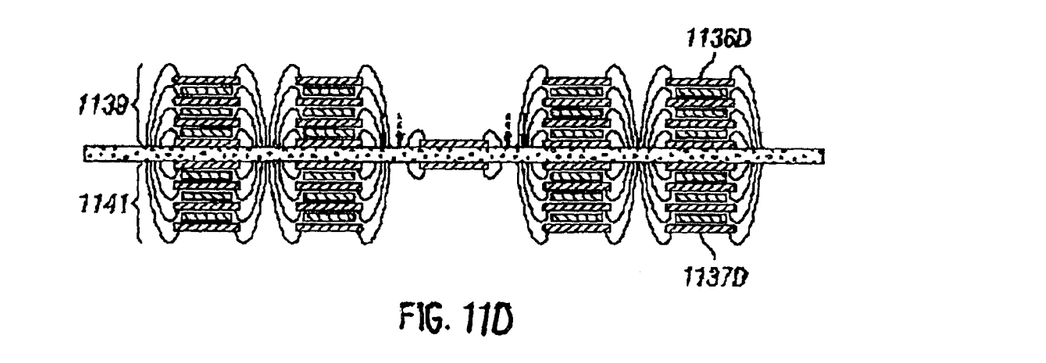

FIG. 10A illustrates a side-view schematic of an MCM subassembly 200 with dies 620 having back-side configuration, according to an example embodiment. FIG. 10B illustrates a top-view schematic of the MCM subassembly 200 of FIG. 10A, according to an example embodiment. As shown in FIGS. 10A-B, dies 620 can be stacked with back side configuration such as where the dies 620 have a back side connection and are of the same size. In example embodiments, a spacer 622 can be included that has a top side 1032 metalized (gold-plated) and a non-conductive back side 1034. The bottom side 1034 of the spacer 622 can be attached to the top side of the die 620 with non-conductive epoxy 624C, while the top side 1032 of the spacer 622 is connected to the back side of the die 620 with conductive epoxy 624D, as shown in FIG. 10. In some embodiments, it can be desirable to include conductive epoxy 624D on the back side of the die 602 because of the connection thereon; conversely, it can be desirable to use non-conductive epoxy on the top side of the die 620 because of the integrated circuits (not shown) thereon which should not be shorted. The top side of the spacer 622 can be wire bonded to the substrate 202, which connects the back side of die 620 and to the bonding pads 628 of the substrate 202.

Aspect 4: Populated Substrate 202 Testing.

In some embodiments, to improve a first pass yield (FPY) at the MCM level, the substrate 202 once populated can be tested before being welded to the MCM housing 204. Testing the substrate 202 prior to welding the substrate 202 to the housing 204 can allow for the substrate 202 to be repaired or replaced more easily, quickly, and/or cheaply. Dedicated substrate pads accessible by the pogo pins, flying probes, or other common tools for board testing that may be recognized by one of ordinary skill in the art having benefit of the present disclosure, can be designed to ease the testing—e.g., boundary scan (BSCAN) test the electric continuity of the module to ensure connections are correctly made and/or functional test.

FIG. 11 illustrates a schematic of a substrate 202 testing procedure, according to an example embodiment. In some embodiments, the dies 620 can be tested layer 1136, 1137 by layer 1136, 1137 to facilitate the repair as shown in FIG. 11. In some embodiments, the first top side layer 1136A of each top stack 1139 can be tested, as well as the first bottom side layer 1137A of each bottom stack 1141. Subsequently, if the layers pass the tests, the second layers 1136B, 1137B, third layers 1136C, 1137C, and fourth layers 1136D, 1137D can be placed on top and tested. Based on the FPY, those steps might be removed to reduce time/cost especially if Known Good dies 620 are used. In some embodiments, if one bad die 620 is located, then the stack (e.g., the top stack 1139 or bottom stack 1141 where the bad die 620 is located) is removed and started over.

Figure 12A:
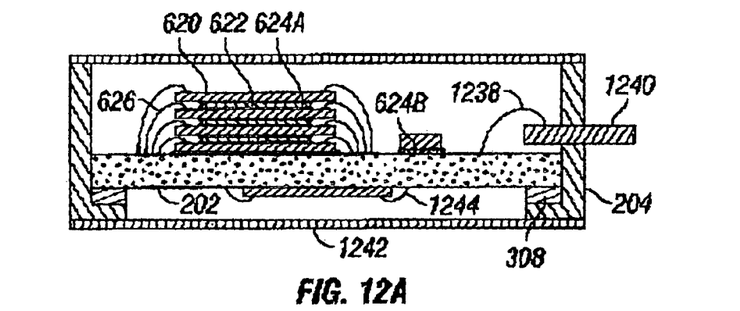
FIG. 12A illustrates a side-view schematic of an MCM subassembly with an intermediate frame, according to an example embodiment.
Figure 12B:
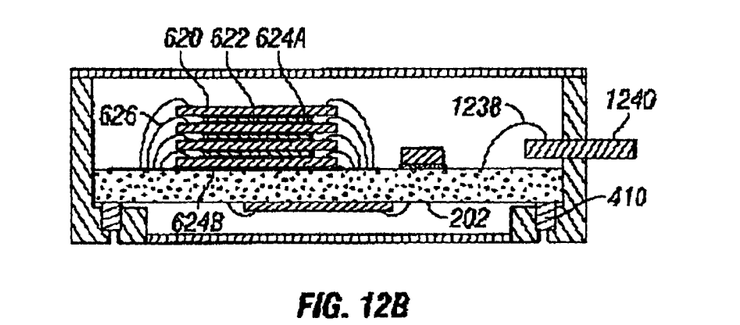
FIG. 12B illustrates a side-view schematic of an MCM subassembly with an intermediate post, according to an example embodiment.
Figure 12C:
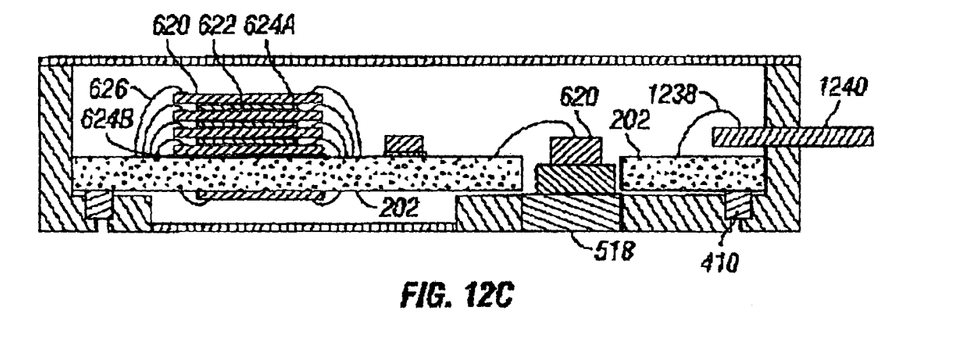
FIG. 12C illustrates a side-view schematic of an MCM subassembly with an intermediate post and a heat sink, according to an example embodiment.

FIG. 12A illustrates a side-view schematic of an MCM subassembly 200 with an intermediate frame 308, according to an example embodiment. FIG. 12B illustrates a side-view schematic of an MCM subassembly 200 with an intermediate post, according to an example embodiment. FIG. 12C illustrates a side-view schematic of an MCM subassembly 200 with an intermediate post and a heat sink 518, according to an example embodiment.

As shown in FIG. 12A, an MCM subassembly 200 can include the substrate 202, with dies 620 and passive components attached thereto. The stacked dies 620 can be separated by spacers 622 with epoxy 624A to glue them together. The dies 620 can be connected to the substrate 202 via bonding wires 626. An intermediate frame 308 can be used to connect the substrate 202 to the housing 204. The dies 620 and components on the bottom side of the substrate 202 can have die 620 attach epoxy 624B and wire bonds to connect to the substrate 202. Additionally, the packaging can include a connector 1240 and bonding wires 1238 connecting the substrate 202 to the connector 1248 for interacting with other outside modules. In example embodiments, a die wire 1244 can be connected a bottom side die 620 to the substrate 202. The bottom side die 620 is located on the back side of the substrate 202 and can be connected to the substrate 202 integrated circuit via the die wire 1244.

The embodiment shown in FIG. 12B is similar to the embodiment of FIG. 12A, but wherein intermediate posts 410 described above are used instead of an intermediate frame 308. FIG. 12C is likewise similar to FIG. 12B, but additionally depicts an example heat sink 518 with a device/component with medium to high power consumption/dissipation mounted on the substrate 202 with high thermal conductivity and then mounted onto the heat sink 518, as described above with reference to FIG. 5.

Figure 13:
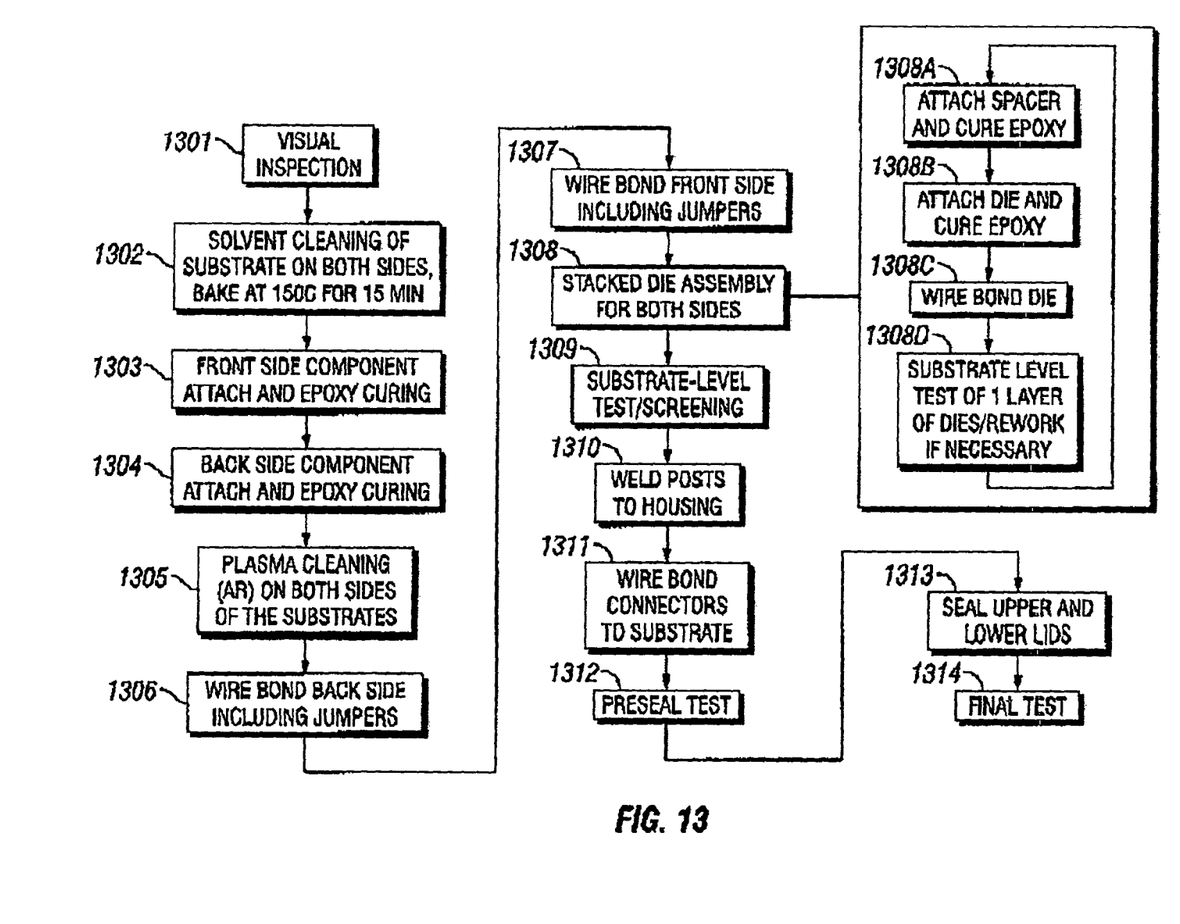
FIG. 13 illustrates a flow diagram of steps of an example assembly process for an MCM assembly packaging, according to an example embodiment.

FIG. 13 illustrates a flow diagram of steps of an example assembly process for an MCM assembly packaging, according to an example embodiment. In step 1301, a visual inspection of the substrate 202 can be performed to identify any non-compliance of substrate 202 plating. Examples of non-compliance that may be detected include plating contamination, nodules, bumps, voids, trace smears, and the like. In step 1302, solvent cleaning of both sides of the substrate 202 can be performed, and then the substrate 202 can be baked. In example embodiments, the substrate 202 can be baked for between 10-20 minutes at a temperature between 120 and 180 degrees Celsius. In steps 1303 and 1304, the active dies 620 and passive components can be attached with conductive glue or non-conductive glue to the substrate 202's front side and back side, respectively. The glues (or other epoxies) also can be cured during these steps. In step 1305, plasma cleaning (with Argon or any other suitable material such as oxygen) can be performed. In steps 1306 and 1307, wire bonding of the back and front sides can be performed, including jumpers.

In step 1308, the stacked die assembly for both sides of the substrate 202 can be made. This step can be further divided into four sub-steps, as shown in FIG. 13. In step 1308A, the spacer 622 can be attached and corresponding epoxy 624A-D can be cured. In step 1308B, the die 620 can be attached and corresponding epoxy 624A-D can be cured. In step 1308C, the die 620 can be wire bonded. In step 1308D, a substrate 202 level test of a layer of dies 620 can be performed. If necessary (e.g., if the test is failed), then reworking of the die layer can start over at step 1308A. Otherwise, step 1308A can re-start for the next die layer.

In step 1309, substrate level tests and screening can be performed. In step 1310, the posts 410 can be welded to the housing 204 (i.e., in an embodiment where posts 410 are used with brazing). In step 1311, the connectors are wire bonded to the substrate 202. In step 1312, a preseal test is performed. In step 1313, the upper and lower lids 1242 are sealed. Finally, in step 1314, the final test is performed.

The exemplary methods and steps described in the embodiments presented previously are illustrative, and, in alternative embodiments, certain steps can be performed in a different order, in parallel with one another, omitted entirely, and/or combined between different exemplary methods, and/or certain additional steps can be performed, without departing from the scope and spirit of the disclosure. Accordingly, such alternative embodiments are included in the disclosure described herein.

Although specific embodiments of the disclosure have been described above in detail, the description is merely for purposes of illustration. Various modifications of, and equivalent steps corresponding to, the disclosed aspects of the exemplary embodiments, in addition to those described above, can be made by those skilled in the art without departing from the spirit and scope of the disclosure defined in the following claims, the scope of which is to be accorded the broadest interpretation so as to encompass such modifications and equivalent structure.

What is claimed is:

1. A high temperature multi-chip module packaging comprising:
    a ceramic substrate having a first side and a second side;
    a housing having at least one hole extending therethrough, wherein the at least one hole has a first diameter portion and a second diameter portion, wherein a shoulder is formed between the first diameter portion and the second diameter portion, and wherein a diameter of the first diameter portion is different than a diameter of the second diameter portion;
    a plurality of metal posts that are brazed to the ceramic substrate and welded to the housing, wherein a base of a first of the metal posts is in physical contact with the shoulder;
    a first active die positioned on the first side of the ceramic substrate;
    a second active die stacked vertically on the first active die;
    one or more bonding pads attached to the first side of the ceramic substrate;

a first bonding wire connected to the first active die and the one or more bonding pads; and a second bonding wire connected to the second active die and the one or more bonding pads.

2. The high temperature multi-chip module packaging of claim 1, wherein the ceramic substrate is brazed to the metal posts before the metal posts are welded to the housing.

3. The high temperature multi-chip module packaging of claim 1, further comprising a heat sink attached to the housing.

4. The high temperature multi-chip module packaging of claim 3, wherein the heat sink is brazed to the housing.

5. The high temperature multi-chip module packaging of claim 3, further comprising at least one power consumption module disposed on the heat sink.

6. The high temperature multi-chip module packaging of claim 5, wherein the at least one power consumption module is mounted directly on the heat sink.

7. The high temperature multi-chip module packaging of claim 5, wherein the at least one power consumption module is mounted on a second substrate, the second substrate comprising at least one of beryllium oxide and aluminum nitride, the second substrate being mounted onto the heat sink.

8. The high temperature multi-chip module packaging of claim 1, further comprising a spacer disposed between the first active die and the second active die.

9. The high temperature multi-chip module packaging of claim 1, wherein the first active die and the second active die are connected with a back side connection.

10. The high temperature multi-chip module packaging of claim 1, wherein the first active die and the second active die comprise a smaller sized die mounted on top of a larger sized die.

11. A method for manufacturing a high temperature multi-chip module packaging comprising:

providing a ceramic substrate having a first side and a second side, wherein a first active die is positioned on the first side of the ceramic substrate, a second active die is stacked vertically on the first active die, and a third active die is positioned on the second side of the ceramic substrate;

connecting a first bonding wire to the first active die and to one or more bonding pads positioned on the first side of the substrate;

connecting a second bonding wire to the second active die and to the one or more bonding pads;

attaching the ceramic substrate to a plurality of metal posts by brazing; and attaching the metal posts to a housing by welding, wherein the housing has at least one hole extending therethrough, wherein the at least one hole has a first diameter portion and a second diameter portion, wherein a shoulder is formed between the first diameter portion and the second diameter portion, wherein a diameter of the first diameter portion is different than a diameter of the second diameter portion, and wherein a base of a first of the metal posts is in physical contact with the shoulder.

12. The method of claim 11, wherein the metal posts are brazed to the ceramic substrate before the metal posts are welded to the housing.

13. The method of claim 12, further comprising attaching a heat sink to the housing.

14. The method of claim 13, further comprising vertically stacking the first active die and the second active die on the substrate.

15. The method of claim 14, further comprising testing the first active die and the second active die on a layer-by-layer basis.

16. A high temperature multi-chip module packaging comprising:

a ceramic substrate having a first side and a second side;

a housing having at least one hole extending therethrough, wherein the at least one hole has a first diameter portion and a second diameter portion, wherein a shoulder is formed between the first diameter portion and the second diameter portion, and wherein a diameter of the first diameter portion is different than a diameter of the second diameter portion;

a plurality of metal posts that are brazed to the ceramic substrate and subsequently welded to the housing, wherein a base of a first of the metal posts is in physical contact with the shoulder;

a heat sink attached to the housing;

a power consumption module disposed on the heat sink;

a first active die positioned on the first side of the ceramic substrate;

a second active die stacked vertically on the first active die;

a third active die positioned on the second side of the ceramic substrate;

one or more bonding pads attached to the first side of the ceramic substrate;

a first bonding wire connected to and extending between the first active die and the one or more bonding pads; and a second bonding wire connected to and extending between the second active die and the one or more bonding pads.

17. The high temperature multi-chip module packaging of claim 1, wherein the first active die and the second active die are substantially rectangular, wherein the second active die is rotated 90 degrees with respect to the first active die, and wherein a non-conductive epoxy is positioned between the first active die and the second active die.

18. The high temperature multi-chip module packaging of claim 1, further comprising a spacer positioned between the first active die and the second active die, wherein a bottom side of the spacer is attached to a top side of the first active die with a non-conductive epoxy, and a top side of the spacer is attached to a bottom side of the second active die with a conductive epoxy.

19. The high temperature multi-chip module packaging of claim 1, wherein the at least one hole is provided as a plurality of holes, wherein each of the metal posts is at least partially positioned within a respective one of the holes in the housing, and wherein a gap exists between the ceramic substrate and the housing.

20. The high temperature multi-chip module packaging of claim 1, wherein the housing is not exposed to brazing.

21. The high temperature multi-chip module packaging of claim 1, wherein the base of the first of the posts is positioned within the first diameter portion, and wherein the diameter of the first diameter portion is greater than the diameter of the second diameter portion.

22. The high temperature multi-chip module packaging of claim 21, wherein the base of the first of the posts is exposed through the second diameter portion.

\* \* \* \* \*